US011811416B2

(12) United States Patent
Kim et al.

(10) Patent No.: US 11,811,416 B2
(45) Date of Patent: Nov. 7, 2023

(54) ENERGY-EFFICIENT ANALOG-TO-DIGITAL CONVERSION IN MIXED SIGNAL CIRCUITRY

(71) Applicant: International Business Machines Corporation, Armonk, NY (US)

(72) Inventors: Kyu-hyoun Kim, Chappaqua, NY (US); Mingu Kang, Old Tappan, NJ (US); Ankur Agrawal, Chappaqua, NY (US); Monodeep Kar, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 17/550,493

(22) Filed: Dec. 14, 2021

(65) Prior Publication Data

US 2023/0188146 A1      Jun. 15, 2023

(51) Int. Cl.
*H03M 1/34* (2006.01)
*H03M 1/00* (2006.01)

(52) U.S. Cl.
CPC ................... *H03M 1/002* (2013.01)

(58) Field of Classification Search
CPC .......... H03M 1/804; H03M 1/38; H03M 1/46; H03M 1/466; H03M 1/66; H03M 1/662; G06F 7/5443; G06F 17/16; G06F 2207/4814; G06F 11/1068; G06F 12/0207; G06F 12/0607; G06F 15/7821; G06F 2207/4802; G06F 2207/4824; G06F 2207/4828; G06F 2212/454; G06F 3/0604;
(Continued)

(56) References Cited

U.S. PATENT DOCUMENTS 6,901,422 B1 *   5/2005   Sazegari ................. G06F 17/16
                                                       708/607
8,352,847 B2 *   1/2013   Gunnam ................. G06F 17/16
                                                       714/801
(Continued)

FOREIGN PATENT DOCUMENTS

WO     WO-2021158861 A1 *   8/2021   ............ G06F 3/0611

OTHER PUBLICATIONS

M. Bagheri et al., "A Mismatch Calibration Technique for SAR ADCs Based on Deterministic Self-Calibration and Stochastic Quantization," IEEE Transactions on Circuits and Systems-I: Regular Papers, vol. 67, No. 9, Sep. 2020, pp. 2883-2896.
(Continued)

*Primary Examiner* — Linh V Nguyen
(74) *Attorney, Agent, or Firm* — Erik Johnson; Ryan, Mason & Lewis, LLP

(57) ABSTRACT

An apparatus comprises at least one processor and at least one memory including instruction code configured to, with the at least one processor, cause the apparatus at least to perform a successive approximation analog-to-digital conversion of an analog input, representing a result of multiplication of first and second vectors, to a digital output by determining an upper bound on the result of multiplication of the first and second vectors, identifying, based at least in part on the determined upper bound, at least a portion of the
(Continued)

successive approximation analog-to-digital conversion to be skipped, and skipping the identified portion of the successive approximation analog-to-digital conversion.

20 Claims, 13 Drawing Sheets

(58) Field of Classification Search
CPC ........ G06F 3/0661; G06F 3/0673; G06F 5/01; G06F 7/76; G06F 9/502
USPC .......................... 341/132, 140, 155, 163, 172
See application file for complete search history.

(56) References Cited

U.S. PATENT DOCUMENTS

| | | | |
|---|---|---|---|
| 8,421,658 B1 | 4/2013 | Yau et al. | |
| 8,570,206 B1 | 10/2013 | Lin | |
| 9,503,118 B2 | 11/2016 | Zhang et al. | |
| 10,020,816 B1 | 7/2018 | Cleris et al. | |
| 10,469,096 B1 | 11/2019 | Ghittori et al. | |
| 10,484,001 B1 | 11/2019 | Soundararajan et al. | |
| 10,790,842 B1 | 9/2020 | Paussa et al. | |
| 2007/0132626 A1 | 6/2007 | Hurrell | |
| 2013/0113638 A1 | 5/2013 | Chen et al. | |
| 2016/0336064 A1* | 11/2016 | Seo | G11C 13/0002 |
| 2016/0336954 A1 | 11/2016 | Tsai | |
| 2019/0131986 A1 | 5/2019 | Vinje et al. | |
| 2019/0149162 A1* | 5/2019 | Lin | H03M 1/38 341/120 |
| 2019/0362787 A1* | 11/2019 | Lu | G11C 13/0069 |
| 2020/0036387 A1 | 1/2020 | Tang | |
| 2020/0133997 A1* | 4/2020 | Roth | G11C 13/0021 |
| 2020/0312406 A1* | 10/2020 | Sharma | G11C 11/54 |
| 2020/0397932 A1* | 12/2020 | Milesi | A61L 2/24 |
| 2021/0271959 A1* | 9/2021 | Chettuvetty | G06N 3/063 |
| 2022/0276835 A1* | 9/2022 | Yang | G11C 11/54 |
| 2022/0350662 A1* | 11/2022 | Ghodrati | G06F 7/5443 |

OTHER PUBLICATIONS

R. Inanlou et al., "Arithmetic Tracking Adaptive SAR ADC for Signals With Low-Activity Periods," IEEE Access, vol. 8, Nov. 24, 2020, pp. 211621-211629.
X.-L. Huang et al., "An MTC-Based Bit-Weight Extraction Technique for Embedded SAR ADC Testing and Calibration," Journal of Electronic Testing, vol. 28, No. 5, Aug. 23, 2012, pp. 705-722.
H. S. Khurana et al., "Recode then LSB-First SAR ADC for Reducing Energy and Bit-Cycles," IEEE International Symposium on Circuits and Systems, May 2018, 5 pages.
S. Nasrin et al., "MF-Net: Compute-In-Memory SRAM for Multibit Precision Inference using Memory-immersed Data Conversion and Multiplication-free Operators," arXiv:2102.00035v1, Jan. 29, 2021, 10 pages.
M. Kang et al., "Multi-Functional In-Memory Inference Processor Using a Standard 6T SRAM Array," IEEE Journal of Solid-State Circuits, vol. 53, No. 2, 2018, 16 pages.
J. Choi et al., "Accurate and Efficient 2-bit Quantized Neural Networks." Proceedings of Machine Learning and Systems, 2019, 12 pages.
P. Mell et al., "The NIST Definition of Cloud Computing," Recommendations of the National Institute of Standards and Technology, Special Publication 800-145, Sep. 2011, 7 pages.
Y. Li et al., "Capacitor-based Cross-point Array for Analog Neural Network with Record Symmetry and Linearity." 2018 IEEE Symposium on VLSI Technology, Jun. 18-22, 2018, pp. 25-26.
H. Jia et al., "A Programmable Heterogeneous Microprocessor Based on Bit-Scalable In-Memory Computing." IEEE Journal of Solid-State Circuits, vol. 55, No. 9, Sep. 2020, pp. 2609-2621.
U.S. Appl. No. 17/012,916, filed in the name of Ankur Agrawal et al. on Sep. 4, 2020, and entitled "Integer Matrix Multiplication Based on Mixed Signal Circuits."

* cited by examiner

100

110

$$R_{out} = \sum_{1}^{64} x_i * w_i \rightarrow R_{out} = \sum_{\substack{m,n \\ 16}} 2^j \sum_{j=0}^{63} x_{i,m} * w_{i,n}$$

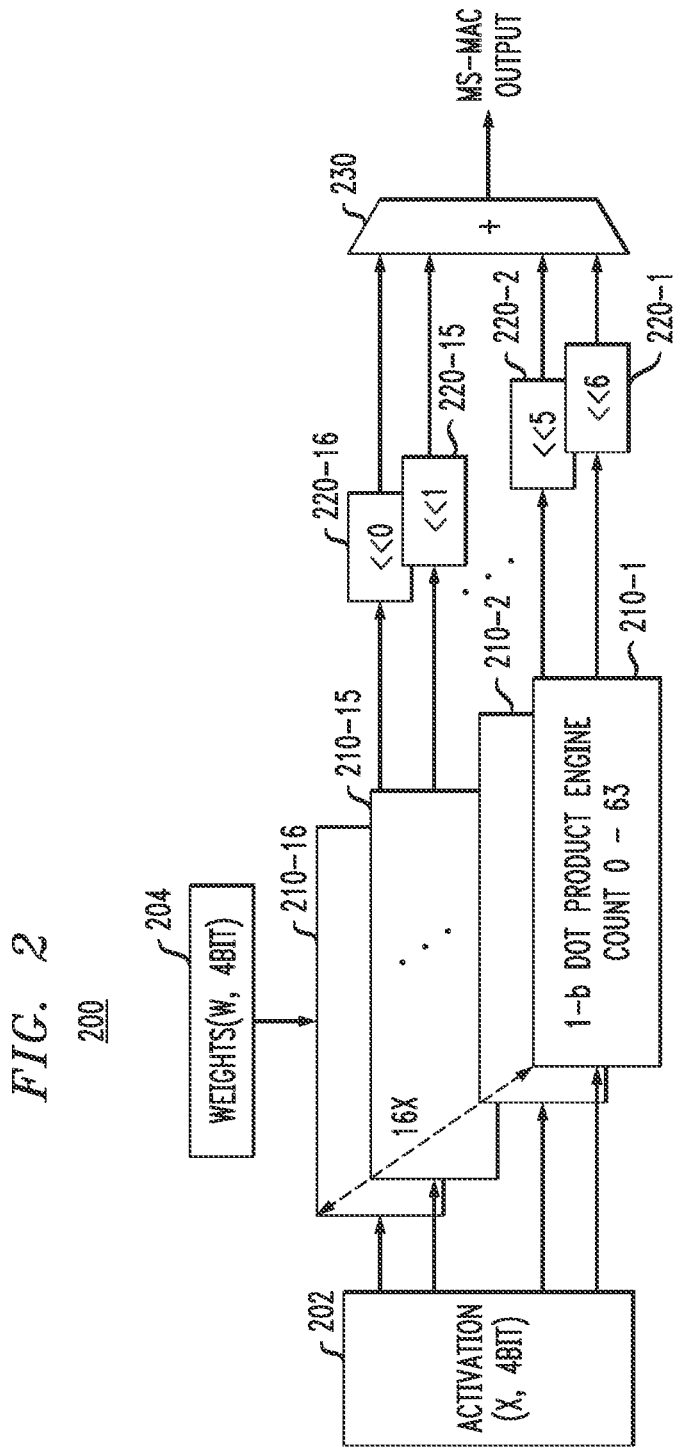

FIG. 4
400

$$\sum_{i=1}^{64} X_i W_i = \sum_{i=1}^{64} (8x_{i3} + 4x_{i2} + 2x_{i1} + x_{i0})(8w_{i3} + 4w_{i2} + 2w_{i1} + w_{i0})$$

$$= \sum_{i=1}^{64} (x_{i0}w_{i0} + 2x_{i0}w_{i1} + 2x_{i1}w_{i0} + \cdots + 64x_{i3}w_{i3})$$

$$= \underbrace{\sum_{i=1}^{64} x_{i0}w_{i0}}_{210\text{-}16} + 2\underbrace{\sum_{i=1}^{64} x_{i0}w_{i1}}_{210\text{-}15} + 2\underbrace{\sum_{i=1}^{64} x_{i1}w_{i0}}_{210\text{-}14} + \cdots + 64\underbrace{\sum_{i=1}^{64} x_{i3}w_{i3}}_{210\text{-}1}$$

| SAMPLING STAGE | 8C | 4C | 2C | 1C |
|---|---|---|---|---|
|  | $V_A$ | $V_A$ | $V_A$ | $V_A$ |
| CYCLE 0 | 1 | 0 | 0 | 0 |
| CYCLE 1 | 0 | 1 | 0 | 0 |
| CYCLE 2 | 0 | 0 | 1 | 0 |
| CYCLE 3 | ... | ... | ... | ... |

ENERGY-EFFICIENT ANALOG-TO-DIGITAL CONVERSION IN MIXED SIGNAL CIRCUITRY

BACKGROUND

The field relates to electronics and, more particularly, to mixed signal circuitry. Mixed signal circuitry operates in both an analog signal domain and a digital signal domain. Accordingly, analog-to-digital conversion (ADC) is typically needed to perform at least some computations. However, ADC conversion energy can be a limiting factor in mixed signal circuit designs.

SUMMARY

Embodiments of the invention provide improved techniques for performing analog-to-digital conversion in mixed signal circuitry.

In one embodiment, an apparatus comprises at least one processor and at least one memory including instruction code. The at least one memory and the instruction code are configured to, with the at least one processor, cause the apparatus at least to perform a successive approximation analog-to-digital conversion of an analog input, representing a result of multiplication of first and second vectors, to a digital output by: determining an upper bound on the result of multiplication of the first and second vectors; identifying, based at least in part on the determined upper bound, at least a portion of the successive approximation analog-to-digital conversion to be skipped; and skipping the identified portion of the successive approximation analog-to-digital conversion.

In another embodiment, a method of performing a successive approximation analog-to-digital conversion of an analog input representing a result of multiplication of first and second vectors to a digital output, comprises the steps of determining an upper bound on the result of multiplication of the first and second vectors, identifying, based at least in part on the determined upper bound on the result of multiplication of the first and second vectors, at least a portion of the successive approximation analog-to-digital conversion to be skipped, and skipping the identified portion of the successive approximation analog-to-digital conversion. The method is executed by processing circuitry configured to execute instruction code.

In another embodiment, a system comprises a multiply-accumulate unit configured to perform binary multiplication of first and second vectors. The multiply-accumulate unit comprises a set of one or more bitwise dot-product summation units each configured to perform bitwise multiplication of at least a portion of the first and second vectors to produce a digital output. Each bitwise dot-product summation unit of the set of one or more bitwise dot-product summation units comprises an instance of a bitwise dot-product computation unit coupled to an instance of a successive approximation register analog-to-digital converter unit, each instance of the successive approximation register analog-to-digital converter unit being configured to convert an analog output of the instance of the dot-product computation unit coupled thereto to at least a portion of the digital output. The successive approximation register analog-to-digital converter unit of at least a given bitwise dot-product summation unit of the set of one or more bitwise dot-product summation units is configured to skip at least a portion of a successive approximation analog-to-digital conversion of the analog output of the dot-product computation unit coupled thereto, the portion of the successive approximation analog-to-digital conversion is identified based at least in part on determining an upper bound on a result of the binary multiplication of the first and second vectors.

These and other features and advantages of embodiments described herein will become more apparent from the accompanying drawings and the following detailed description.

BRIEF DESCRIPTION OF THE DRAWINGS

FIG. 2 depicts mixed signal multiply-accumulate circuitry with which one or more illustrative embodiments can be implemented.

FIG. 4 depicts an algebraic representation of a dot product computation with which one or more illustrative embodiments can be implemented.

FIGS. 5A-5C depict a sampling stage and multiple cycles of operation of a successive approximation register analog-to-digital converter according to an illustrative embodiment.

DETAILED DESCRIPTION

Figures 1A, 1B:
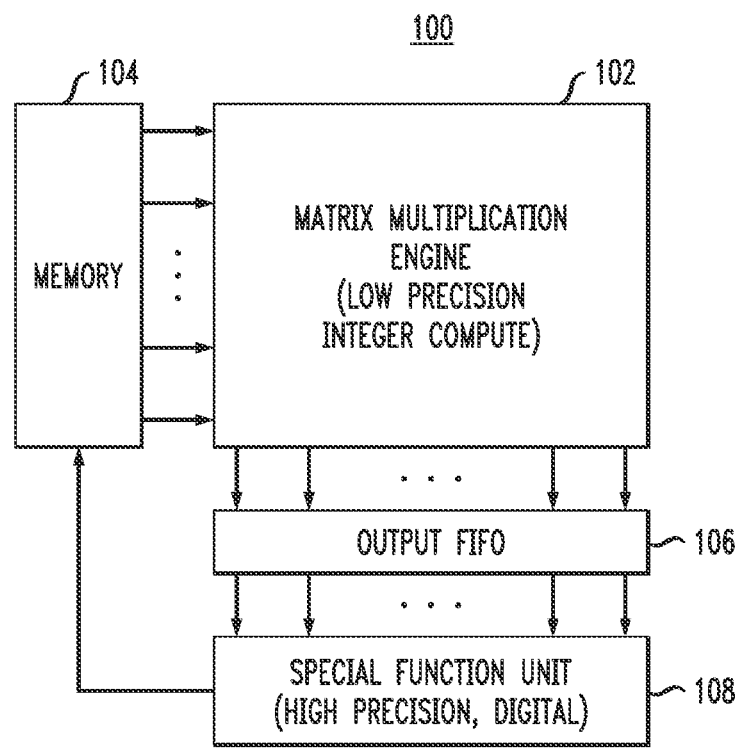
FIGS. 1A and 1B respectively depict a neural network accelerator and a mathematical representation of computations performed therein with which one or more illustrative embodiments can be implemented.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Further, it is to be understood that the phrase "configured to" as used in conjunction with a circuit (the term "circuitry" may be used interchangeably herein), structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, logic gates, etc.), programmable elements, processing devices, one or more integrated circuits and/or other types of circuitry, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, integrated circuits and/or other types of circuitry that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

A neural network model is one of the most widely used types of machine learning (ML) algorithms in artificial intelligence systems. For example, a neural network model can be used to recognize underlying relationships and/or patterns in a set of data through a process that mimics the manner in which the human brain operates. The neural network model is first trained using a training data set (training stage), and then the trained neural network model is used to recognize relationships and/or patterns in a target data set (inference stage).

Many workloads that execute a neural network model require a large number of matrix multiplications which typically involve multiply-accumulate (MAC) operations. It is realized that accumulate operations are generally energy-inefficient when performed in the digital signal domain, but much more energy-efficient in the analog signal domain. As such, it has further been realized that by combining digital signal domain techniques for multiplication and analog signal domain techniques for accumulation, a more efficient multiply-accumulate operation can be achieved. Circuitry that combines analog and digital processing to perform MAC operations is referred to as mixed signal MAC (MS-MAC) circuitry.

FIG. 1A illustrates a neural network accelerator 100 with which one or more illustrative embodiments can be implemented. In some illustrative embodiments, neural network accelerator 100 is implemented in one or more graphics processing units (GPUs), one or more field programmable gate arrays (FPGA), one or more application-specific integrated circuits (ASICs), one or more multi-core central processing units (CPUs) and/or other types of circuitry. By way of example, neural network accelerator 100, or portions thereof, can comprise one or more of the above devices customized for a particular purpose that comprise circuitry (e.g., circuits, processors, memory, etc.) that are programmed with executable program code (e.g., instruction code, computer program code, etc.) or otherwise configured for the particular purpose. By way of example only, the particular purpose can be the implementation and execution of an artificial intelligence system (e.g., machine learning algorithm). Neural network accelerator 100 may also be part of a system-on-chip (SoC), e.g., such as a neuromorphic computing system. However, neural network accelerator 100 can be used in a variety of other applications that would benefit from such artificial intelligence-based decision making.

As shown, neural network accelerator 100 comprises a matrix multiplication engine 102 configured to perform computations corresponding to convolution layers and fully-connected layers of a neural network, which can typically be performed using low precision integer computations on data from memory 104. Results are then forwarded via an output first-in-first-out (FIFO) data structure 106 to a special function unit 108 that performs computations corresponding to one or more activation functions such as, but not limited to, batch normalization, a sigmoid function, a rectified linear unit (ReLU) function, and a SoftMax function. Computations in special function unit 108 typically need to be performed in high-precision to preserve the accuracy of the neural network that is mapped to the accelerator.

However, it is realized that matrix multiplication represents the bulk of the computation in neural network workloads, and thus matrix multiplication engine 102 can consume a significant percentage of the total power consumed by neural network accelerator 100. It is further realized that the low-precision integer computations being performed in matrix multiplication engine 102 can be performed by operating at least partially in the analog domain resulting in an accelerator with lower total power consumption compared to an accelerator that performs the entirety of its computations in the digital domain utilizing digital circuits.

FIG. 1B illustrates a mathematical representation 110, in accordance with an illustrative embodiment, to enable a vector dot product (also referred to as an inner product herein, as will be further explained) computed by one or more multiply-accumulate operations in neural network accelerator 100 of FIG. 1A. In the example of FIG. 1B, the left-side equation mathematically represents the dot product of two vectors x and w, each of size 64, where elements $x_i$ and $w_i$ each have 4 bits. Each four bit by four bit product (4b*4b) is split into 16 one bit by one bit products (1b*1b). The right-side equation mathematically represents the 1b*1b multiplication, where and $w_{i,n}$ each have 1 bit.

The bitwise product is performed first, and then the summation is performed based on the weights of the bits. In essence, the 4-bit by 4-bit term is split into 16 one-bit products, and the one-bit products are accumulated (summed) and then appropriately scaled by a power of two by the outer summation to generate an aggregate sum. Based on power considerations, the 1b*1b multiplication is performed in the digital domain, the inner summation of the 1b*1b multiplication is performed in the analog domain, and the outer summation is performed in the digital domain. The inner summation is performed in the analog domain as this is where analog circuitry outperforms digital circuitry in terms of power. The 16-way addition may be performed in the digital domain as there is little advantage to doing this in the analog domain. In one example embodiment, the inputs and outputs of the inner summation are digital.

Note that FIG. 1B represents one illustrative embodiment and thus other embodiments can use different partitioning of analog and digital domain computations. Furthermore, it is also to be appreciated that the dot product computation depicted as mathematical representation 110 is intended as an example to facilitate explanation. Thus, implementations wherein dot products of vectors x and w where elements $x_i$ and $w_i$ have a different number of bits, as well as where one vector has a different number of elements as compared to the other vector, are supported by alternative embodiments based on the teachings provided herein.

FIG. 2 illustrates a mixed signal multiply-accumulate circuit 200 for performing integer matrix multiplication, in accordance with an illustrative embodiment. It is to be appreciated that part or all of mixed signal multiply-accumulate circuit 200 can be implemented, in some embodiments, as part of matrix multiplication engine 102 of FIG. 1. As shown, each bit $x_i$ of a first digital input X, and the corresponding bit representing the digital weight $w_i$ of a second digital input W, are input into one of 16 1-bit (1-b) dot product engines 210-1, 210-2 . . . , 210-15, 210-16 (collectively referred to as dot product engines 210 herein). The dot product engines 210 can be referred to as counters since they, effectively, count the number of 1s that occur in the binary multiplication operations, as will be further explained below. In one example, the first digital input X represents an activation function represented by elements of 4 bits, while the second digital input W represents weights represented by elements of 4 bits. Digital partial sums 220-1, 220-2 . . . , 220-15, 220-16 (collectively referred to as partial sums 220 herein) are respectively output by dot product engines 210-1, 210-2 . . . , 210-15, 210-16. Digital partial sums 220 are input into a digital reduction circuit 230 which performs an outer summation to generate the MS-MAC output.

Figure 3A:
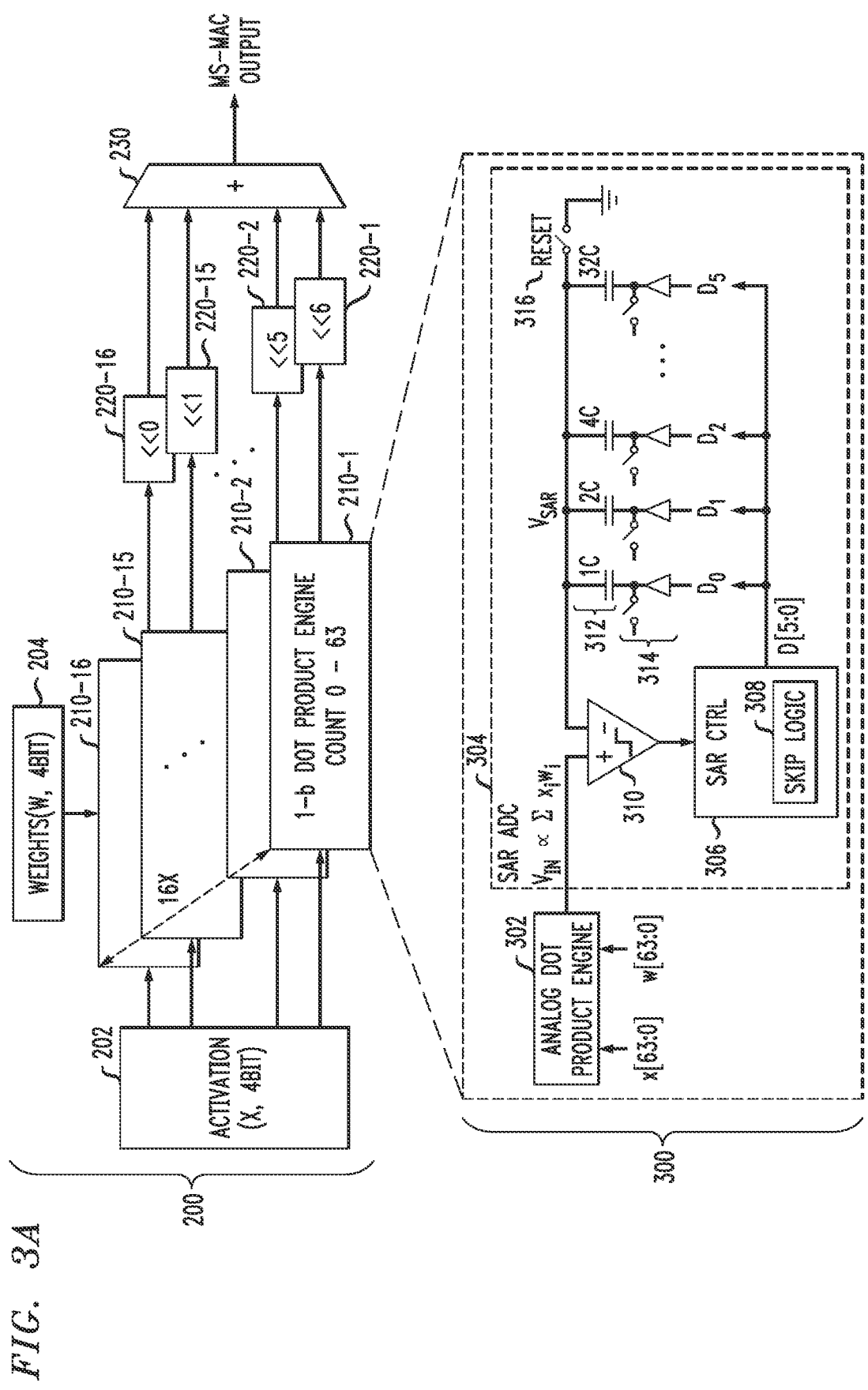
FIGS. 3A and 3B depict dot product engines with which one or more illustrative embodiments can be implemented.
Figure 3B:
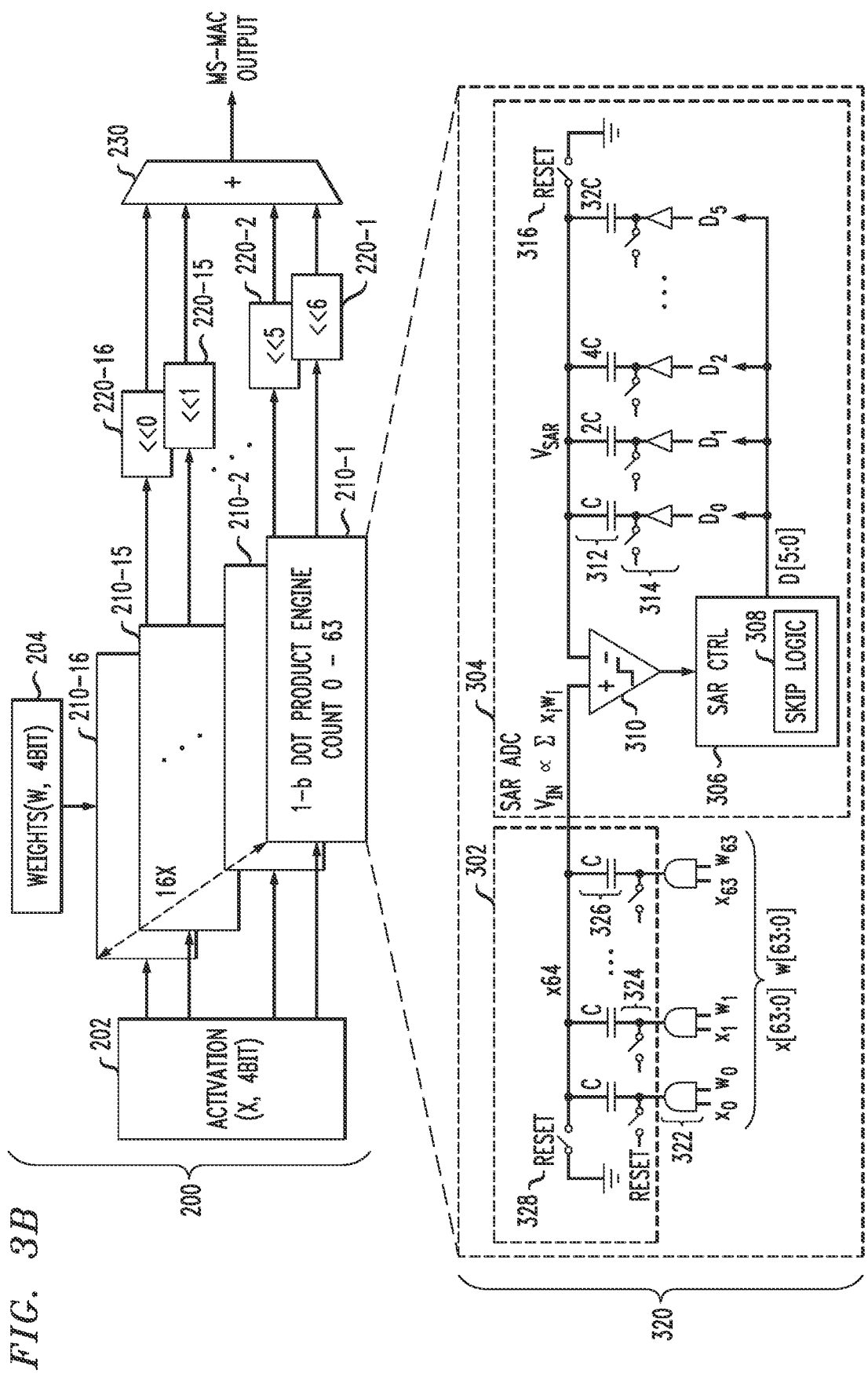

FIGS. 3A and 3B illustrate examples of MS-MAC circuitry configured for inner product summation performed by dot product engines 210 in accordance with illustrative embodiments. In the illustrative embodiments of FIGS. 3A and 3B, it is assumed that the input vectors X and W each comprise 63 elements, and each element comprises 4 bits. In general, MS-MAC circuitry performs multiplication in the digital signal domain using digital logic and accumulation in the analog domain using charge-sharing capacitors. Effectively, MS-MAC circuitry multiplies digital inputs in the digital domain, accumulates multiplication results in the analog domain, and generates a binary-weighted digital code based on the accumulated results. The number of bits of the binary-weighted digital code are referred to as the analog resolution or quantization level (p) of the analog-to-digital conversion operation performed by MS-MAC circuitry. In order to generate a unique binary-weighted code for a set of 63-bit inputs, p is 6, i.e., D[0: 5]. Throughout FIGS. 3A and 3B, circuit elements which provide like or similar functionality utilize the same or similar reference numerals.

More particularly, as shown in FIG. 3A, MS-MAC circuitry 300 includes an analog dot product engine 302 and a successive approximate register (SAR) ADC 304. As shown, the analog dot product engine 302 provides an output $V_{IN}$ to a comparator 310 of the SAR ADC 304, where the input $V_{IN}$ is proportional to the sum of the weights $\Sigma x_i w_i$ produced by the analog dot product engine 302. The analog dot product engine 302 receives inputs x[63: 0] and w[63: 0], and produces the output $V_{IN} \propto \Sigma x_i w_i$. The output of the comparator 310 is input to a SAR controller 306, which implements skip logic 308 discussed in further detail elsewhere herein. The SAR controller 306 outputs the binary-weighted code D[0: 5], which is provided to a set of capacitors 312 (with respective capacitance values C, 2C, 4C, 8C, 16C, 32C). It is to be appreciated that the bits of the binary-weighted code D[0: 5] are respectively coupled to the set of capacitors 312 (e.g., from the most significant bit (MSB) through to the least significant bit (LSB)). For 6-bit quantization, the MSB (D5) of the binary-weighted output of SAR controller 306 is coupled to the 32C capacitor, the next bit (D4) is coupled to a 16C capacitor, the next bit (D3) is coupled to an 8C capacitor, the next bit (D2) is coupled to an 4C capacitor, the next bit (D1) is coupled to the 2C capacitor, and the LSB (D0) is coupled to the 1C capacitor. The binary-weighted code D [0: 5] output from the SAR controller 306 is provided to the bottom plates of the capacitors 312 through a set of buffers and switches 314 as illustrated. The SAR ADC 304 also includes a reset switch 316, which when opened allows the top plates of the capacitors 312 to electrically float.

FIG. 3B shows MS-MAC circuitry 320 illustrating an example implementation of the analog dot product engine 302. As shown in FIG. 3B, the analog dot product engine 302 includes a set of 64 AND gates 322, each of which performs multiplication of a corresponding set of the inputs x[63: 0] and w [63: 0]. The outputs of the AND gates 322 (i.e., $x_0*w_0$, $x_1*w_1$, . . . , $x_{63}*w_{63}$) are coupled via reset switches 324 to bottom plates of capacitors 326, each of which has a same capacitance value C. The analog dot product engine 302 further includes a reset switch 328. The top plates of the capacitors 326 provide the output $V_{IN} \propto \Sigma x_i w_i$ to the comparator 310.

In illustrative embodiments, a dot product $[\Sigma_{i=1}^{64} X_i W_i]$ is computed in a mixed-signal domain, where $X_i$ and $W_i$ may be low-precision (e.g., four-bit integers, INT4). As described elsewhere herein, computing the dot-product is advantageous from a power perspective over fully-digital implementations. Illustrative embodiments described herein provide techniques for saving computation cycles and power for such dot-product computations under certain designated conditions.

FIG. 4 depicts an algebraic representation 400 associated with the dot product computation performed by the dot product engines 210. The dot product engines 210, which are illustratively implemented as pop-counters in the analog domain, count the number of 1's (non-zeros) amongst 64-bitwise multiplications. For 64-bitwise multiplications, this may be represented as:

$$\sum_{1}^{64} x_i * w_i \Rightarrow \underbrace{\sum_{m,n} 2^j \sum_{i=0}^{63} x_{i,m} * w_{i,n}}_{16}$$

where binary numbers (products) are decomposed into multiple bit positions. After decomposition, 16 terms are generated, each of which will be computed by an analog pop counter (e.g., one of the dot product engines 210). The final output is computed in the digital back-end (e.g., with shifters and adders). The computation of:

$$\sum_{i=0}^{63} x_{i,m} * w_{i,n}$$

is illustratively performed in the analog domain, with the computation of:

$$\underbrace{\sum_{m,n} 2^j}_{16}$$

being performed in the digital domain. As shown in FIG. 4, each of the "boxes" may be replaced by an analog pop-counter (e.g., one of the dot product engines 210). Thus, the term $\Sigma_{i=1}^{63} x_{i0}w_{i0}$ may be implemented via dot product engine 210-1, the term $\Sigma_{i=1}^{63} x_{i0}w_{i1}$ may be implemented via dot product engine 210-2, the term $\Sigma_{i=1}^{63} x_{i1}w_{i0}$ may be implemented via dot product engine 210-3, . . . and the term $\Sigma_{i=1}^{63} x_{i3}w_{i3}$ may be implemented using the dot product engine 210-16.

More particularly, consider that there are 64 X's in input 202 and 64 W's in input 204, and that each X and W has 4-bit precision such that 64 multiplications (e.g., products)

are being performed, and all those products are added up. Further consider one multiplication out of the 64, called X times W (where capital X and W means that each of these are represented in 4-bit binary numbers). X may be rewritten as 8a+4b+2c+1d and W may be rewritten as 8p+4q+2r+1s. X times W thus becomes:

$$X*W=(8a+4b+2c+1d)(8p+4q+2r+1s)$$

$$X*W=64ap+32bp+16cp+8dp+32aq+16bq+8c+4dq+\\16ar+8br+4cr+2dr+8as+4bs+2cs+1ds$$

$$X*W=64ap+32(bp+aq)+16(cp+bq+ar)+8(dp+cq+br+\\as)+4(dq+cr+bs)+2(dr+cs)+1ds$$

Thus, it can be seen that different terms will be multiplied by factors 64, 32, 16, . . . , 1, and there is some overlap. For example, three terms cp, bq and ar are multiplied by the same factor of 16. For binary numbers, multiplication by 16 ($=2^4$) may be achieved through a simple shift by 4 bits. Thus, multiplication by the factors 64, 32, 16, 8, 4, 2 and 1 may be represented as <<6, <<5, <<4, <<3, <<2, <<1 and <<0 (where "<<" means shift by left). This is denoted in the digital partial sums 220 described above with respect to FIGS. 2, 3A and 3B (e.g., digital partial sum 220-1 is <<6, digital partial sums 220-2 and 220-3 are <<5, digital partial sums 220-4 through 220-6 are <<4, digital partial sums 220-7 through 220-10 are <<3, digital partial sums 220-11 through 220-13 are <<2, digital partial sums 220-14 and 220-15 are <<1, and digital partial sum 220-16 is <<0).

Under certain conditions, it is possible to know or predict ahead of time when the output of the SAR ADC 304 will be a small value, such that computation of some of the MSBs can be skipped to provide power savings. Such conditions include, but are not limited to: inference workloads where weights are known ahead of time; and zero-padding computations. For inference workloads where weights are known ahead of time, there may be situations where some percentage of the weight values (e.g., bits) in a given computation are zero. If enough of the weight values are zero, then the result of the analog-to-digital conversion in the SAR ADC 304 will be below some limit value that is less than the overall maximum. Depending on the limit value, a certain number of MSB computations can be skipped accordingly as will be discussed in further detail below. For zero-padding, if there is not enough computation to utilize the entire width of the multiply-accumulate hardware, then the workload mapping to the hardware results in a number of terms to be added that is less than (e.g., potentially much less than) the width of the accumulator (e.g., when the accumulation dimension is input-channels, and the first few layers have less than 64 input channels). Consider, as an example, a convolutional filter passing over an input image or matrix of values, where at the edges of the input image or matrix of values the convolutional filter is at least partially outside of the input such that some of its entries are zero-padded.

Stated another way, consider the following bitwise multiplication:

$$\sum_{i=1}^{N} x_i * w_i \leq 2^M * \sum_{i=1}^{N} w_i \leq 2^M * N * 2^M$$

where $x_i$ is an M-bit signed value (e.g., $-2^M \leq x_i \leq 2^M-1$), $w_i$ is an M-bit unsigned value (e.g., $0 \leq w_i \leq 2^M-1$), and N is the number of terms being added. Essentially, the summation is limited to a maximum value $2^M*N*2^M$ corresponding to the case where all weights are their maximum value. This corresponds to:

$$N*x_i*w_i \leq 2^{P+2\cdot M} = 2^k$$

As a concrete example, let the value of N (e.g., the number of terms being added) be 64 and the value of M=4. In this example, P=6. 64 products are added and each product is 4 bit×4 bit, such that the total can be a maximum value of 64*16*16.

Given the above, the maximum possible dot product result $\vec{x}\cdot\vec{w}_i$, regardless of the input may be determined as follows:

$$x=[x_1 x_2 \ldots x_N], \vec{w}_i=[w_{i1} w_{i2} \ldots w_{iN}], \text{ where } 0 < x_n \leq x_{max}$$

$$\vec{x}\cdot\vec{w}_i \leq x_{max}\sum_{n=1}^{N}\max(w_{in},0)=s\cdot N(w_{max}x_{max}) \leq N\\(w_{max}x_{max})$$

where $w_{max}$ is the maximum possible value of $w_{in}$, (N $w_{max}x_{max}$) is mapped on the SAR ADC 304 input's maximum voltage (e.g., $V_{DD}$). Any weight that is less than $w_{max}$ will contribute to reduce s from 1. Using the values s and N, the skip logic 308 can determine whether any of the MSB calculations in the SAR ADC 304 can be skipped.

As noted above, under certain conditions it may be known or predicted that the sum is limited to a value less than the maximum (e.g., potentially, much less than the maximum). For inference, the values of the weights are known ahead of the computation time. Thus, the equation (e.g., $2^M*N*2^M$) can be computed "offline" to determine a maximum resolution of the inner-product. Depending on the maximum resolution, some of the SAR ADC 304's MSB computations can be skipped. Similarly, for the zero-padding case, if N is smaller than half of $2^k$ where k is the SAR ADC 304 resolution, some of the SAR ADC 304's MSB computations can be skipped.

Figure 5A:
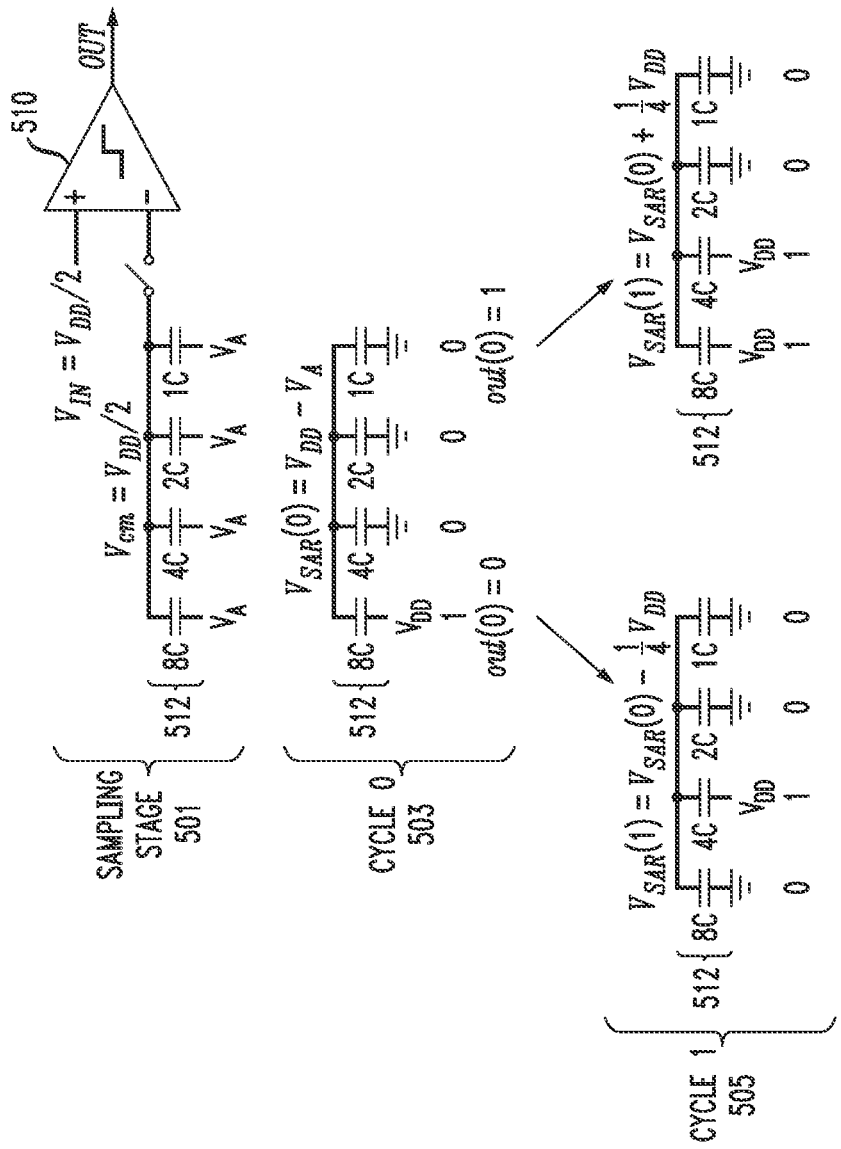
Figure 5B:
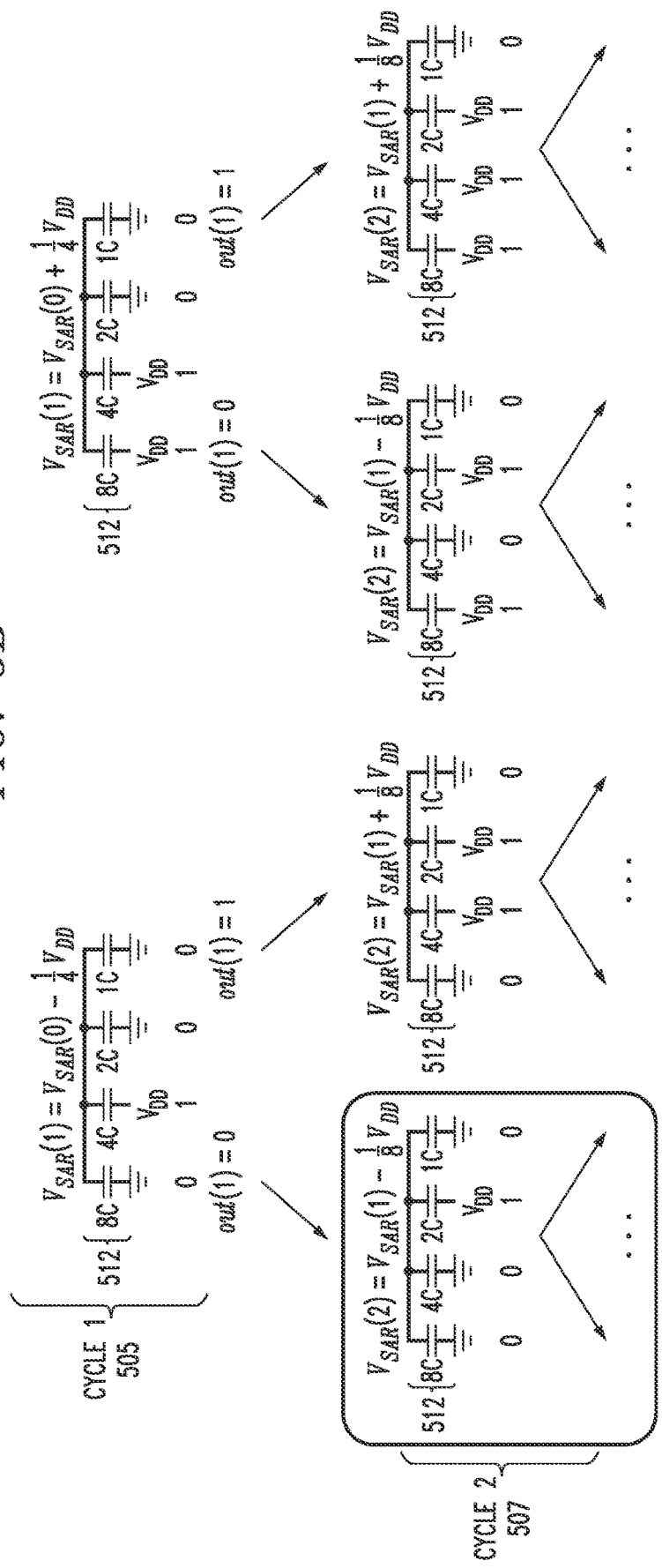

FIGS. 5A-5C show an example of operation of a SAR ADC (e.g., SAR ADC 304) for a 4-b case. Here, the capacitor 510 (e.g., similar to capacitor 310 of SAR ADC 304) receives at its positive node an input voltage $V_{IN}$ (e.g., from analog dot product engine 302), and receives at its negative node the voltage $V_{SAR}$ from capacitor bank 512. The output of the comparator 510, denoted out, is a binary value characterizing whether $V_{IN}$ is greater than $V_{SAR}$. A controller, such as SAR controller 306, sets the value of $V_{SAR}$ to different values in different cycles to "search" the space and find a digital binary code that matches $V_{IN}$. This search will typically start with setting $V_{SAR}$ to its midpoint value (e.g., half its maximum value, $V_{DD}/2$) in a first cycle, and in subsequent cycles the value of $V_{SAR}$ is either increased or decreased depending on the value of out in the previous cycle.

As shown in FIG. 5A, before the search begins a sampling stage 501 is performed where the voltages at the positive and negative nodes of the comparator 510 are set to a known value, such as $V_{CM}$ denoting the natural common-mode voltage of the comparator 510 the comparator 501 (e.g., a voltage at which the comparator 510 is most likely to have the best sensitivity/noise characteristics). In some embodiments, $V_{cm}=V_{DD}/2$. The comparator 510 is differential, with its negative node being attached to the common node of capacitor bank 512 (e.g., representing $V_{SAR}$), with its positive node being connected directly to $V_{IN}$. During the sampling stage 501, the bottom plates of the capacitors in the capacitor bank 512 are set to a voltage $V_A$, where the voltage $V_A$ is statistically close to 0.

In a first cycle 503 (cycle 0), the bottom plate of the 8C capacitor in the capacitor bank 512 is set to $V_{DD}$, with the 4C, 2C and 1C capacitors in the capacitor bank 512 being held to ground. Thus, the negative node of the comparator 510 in cycle 1 is set to $V_{SAR}(0)=V_{DD}-V_A$. In other words, the 4-b digital value applied to the capacitor bank 512 is 1000. Depending on the output, out, of the comparator 510 in the first cycle 503 (out(0)), processing proceeds differently in the second cycle 505 (cycle 1). If the value of out(0) is 0, this corresponds to $V_{SAR}$ (the voltage from the capacitor bank 512) being greater than $V_{IN}$ (the voltage provided from analog dot product engine 302), such that $V_{SAR}$ is decreased in the second cycle 505 (cycle 1). If the value of out(0) is 1, this corresponds to $V_{SAR}$ (the voltage from the capacitor bank 512) being less than $V_{IN}$ (the voltage provided from analog dot product engine 302), such that $V_{SAR}$ is increased in the second cycle 505 (cycle 1). FIGS. 5A and 5B show these two branches of the second cycle 505.

In the first branch of the second cycle 505 (e.g., where out(0)=0), the 8C, 2C and 1C capacitors of the capacitor bank 512 are held to ground, with the 4C capacitor of the capacitor bank 512 being set to $V_{DD}$. Thus, $V_{SAR}(1)=V_{SAR}(0)-¼V_{DD}$. In other words, the 4-b digital value applied to the capacitor bank 512 is 0100. In the second branch of the second cycle 505 (e.g., where out(0)=1), the 8C and 4C capacitors of the capacitor bank 512 are set to $V_{DD}$, and the 2C and 1C capacitors of the capacitor bank 512 are held to ground. Thus, $V_{SAR}(1)=V_{SAR}(0)+¼V_{DD}$ In other words, the 4-b digital value applied to the capacitor bank 512 is 1100. As shown in FIG. 5B, depending on the output, out, of the comparator 510 in the second cycle 505 (out(1)), processing proceeds differently in the third cycle 507 (cycle 2). If the value of out(1) is 0, this corresponds to $V_{SAR}$ (the voltage from the capacitor bank 512) being greater than $V_{IN}$ (the voltage provided from analog dot product engine 302), such that $V_{SAR}$ is decreased in the third cycle 507. If the value of out(1) is 1, this corresponds to $V_{SAR}$ (the voltage from the capacitor bank 512) being less than $V_{IN}$ (the voltage provided from analog dot product engine 302), such that $V_{SAR}$ is increased in the third cycle 507.

As shown in FIG. 5B, the third cycle 507 has four branches (two from the first branch of the second cycle 505, and two from the second branch of the second cycle 505). In the first branch of the third cycle 507 (e.g., where out(0)=0 and out(1)=0), the 8C, 4C and 1C capacitors of the capacitor bank 512 are held to ground, with the 2C capacitor of the capacitor bank 512 being set to $V_{DD}$. Thus, $V_{SAR}(2)=V_{SAR}(1)-⅛V_{DD}$. In other words, the 4-b digital value applied to the capacitor bank 512 is 0010. In the second branch of the third cycle 507 (e.g., where out(0)=0 and out(1)=1), the 8C and 1C capacitors of the capacitor bank 512 are held to ground, and the 4C and 2C capacitors of the capacitor bank 512 are set to $V_{DD}$. Thus, $V_{SAR}(2)=V_{SAR}(1)+⅛V_{DD}$. In other words, the 4-b digital value applied to the capacitor bank 512 is 0110.

In the third branch of the third cycle 507 (e.g., where out(0)=1 and out(1)=0), the 8C and 2C capacitors of the capacitor bank 512 are set to $V_{DD}$, with the 4C and 1C capacitors of the capacitor bank 512 being held to ground. Thus, $V_{SAR}(2)=V_{SAR}(1)-⅛V_{DD}$. In other words, the 4-b digital value applied to the capacitor bank 512 is 1010. In the fourth branch of the third cycle 507 (e.g., where out(0)=1 and out(1)=1), the 8C, 4C and 2C capacitors of the capacitor bank 512 are set to $V_{DD}$, and the 1C capacitor of the capacitor bank 512 is held to ground. Thus, $V_{SAR}(2)=V_{SAR}(1)+⅛V_{DD}$. In other words, the 4-b digital value applied to the capacitor bank 512 is 1110.

FIG. 5C shows a table 509 summarizing the voltages of the bottom plates of the 8C, 4C, 2C and 1C capacitors of the capacitor bank 512 in the sampling stage 501, the first cycle 503 (cycle 0), the second cycle 505 (cycle 1), the third cycle 507 (cycle 2), and so on assuming a path where out(0)=0 and out(1)=0. In the transition between the sampling stage 501 and the first cycle 503, there is an expensive high capacitance toggling of the 8C capacitor of the capacitor bank 512. Similarly, in the transition between the first cycle 503 and the second cycle 505, there is an expensive high capacitance toggling of the 4C capacitor of the capacitor bank 512. Thus, significant savings may be achieved by skipping the first cycle 503 (cycle 0) and the second cycle 505 (cycle 1) if it is known a priori that the final result will belong to the first branch of the third cycle 507 (cycle 2). This is the case, for example, where the weight values are known in advance such that the maximum possible value of $V_{IN}$ corresponds to the 4-b digital code 0010. By proceeding directly from the sampling stage 501 to the third cycle 507 (cycle 2), the high capacitance toggling of the 8C and 4C capacitors of the capacitor bank 512 is avoided leading to significant energy savings. Further, the comparator 510 and SAR control logic are not operated in the first cycle 503 (cycle 0) and the second cycle 505 (cycle 1), which also leads to energy savings.

Figure 6:
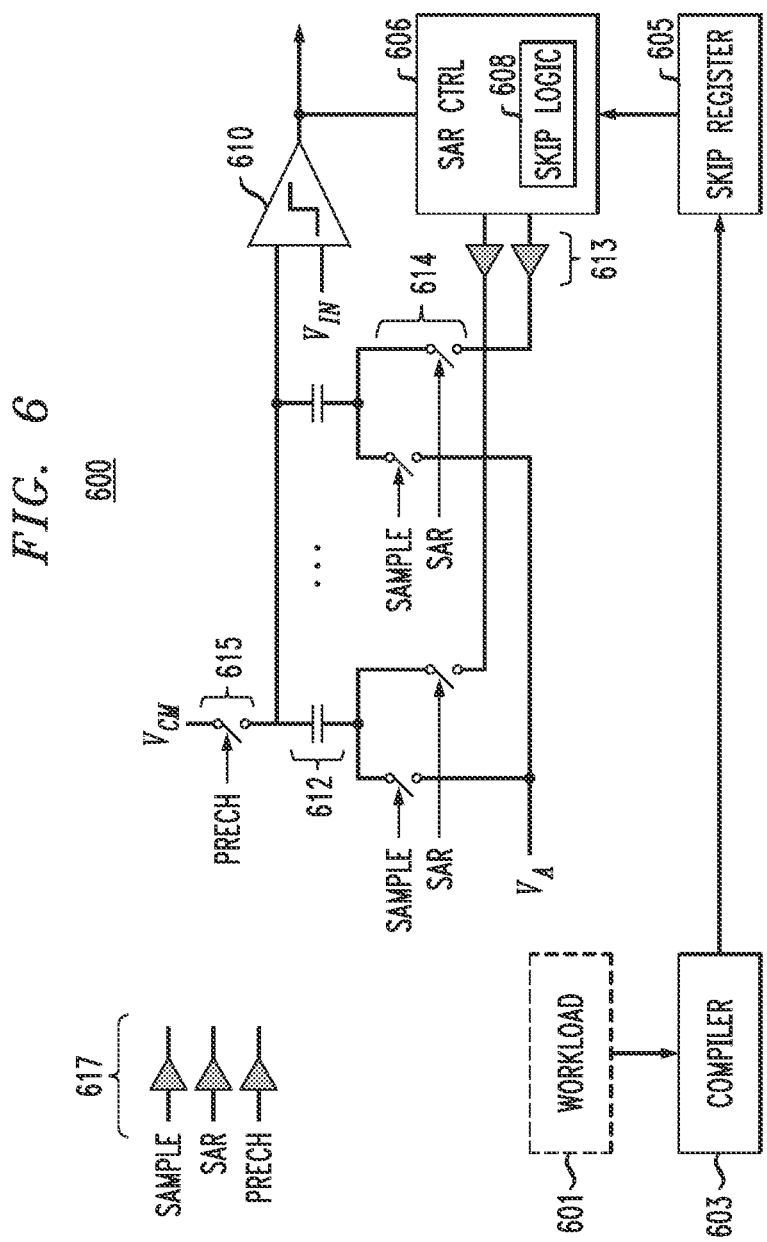
FIG. 6 depicts skip logic implemented in multiply-accumulate circuitry according to an illustrative embodiment.

FIG. 6 shows a hardware implementation of SAR ADC circuitry 600. The SAR ADC circuitry 600 includes a SAR controller 606 implementing skip logic 608, a comparator 610, capacitor bank 612, sets of buffers 613 and switches 614, and a set of buffered control signals 617. The control signals 617 include a "sample" control signal that controls one of the switches 614 for each of the capacitors in the capacitor bank 612 to allow the SAR controller 606 to selectively apply $V_A$ to bottom plates of the capacitors of the capacitor bank 612. The control signals 617 also include a "sar" control signal that controls one of the switches 614 for each of the capacitors in the capacitor bank 612 to allow the SAR controller to selectively apply voltages corresponding to different digital binary codes to the bottom plates of the capacitors in the capacitor bank 612. The control signals 617 further include a "prech" control signal that controls a precharge switch 615 that selectively applies a common mode voltage $V_{CM}$ to the top plates of capacitors of the capacitor bank 612.

As illustrated, a workload 601 (e.g., an AI workload) is provided as input to a compiler 603. The compiler 603 analyzes the workload 601 to determine whether bit skipping (e.g., of MSBs of the binary digital codes) can be applied by the SAR ADC circuitry 600 (e.g., as a result of zero-skipping or zero-valued weights in an AI workload). The compiler 603 stores in a skip register 605 an indication of how many bits can be skipped. The SAR controller 606 accesses the skip register 605 to determine how many bits should be skipped during an instance of converting an analog input value (e.g., $V_{IN}$ from analog dot product engine 302) to a binary digital code. The skip logic 608 then implements bit skipping for the determined number of bits. Thus, as illustrated in the example of FIGS. 5A-5C, if the weights are known in advance it may be possible to skip the first two cycles (e.g., the two MSBs). This can provide significant energy savings in the SAR ADC circuitry 600. Assuming that 2 bits can be skipped on average, for example, 40% or greater energy savings may be achieved.

In some embodiments, a mixed-signal multiply-accumulate circuit is designed which takes into account pre-computed knowledge of the upper bounds of results to skip certain SAR ADC conversion steps thereby saving conversion energy and speeding up computations. Consider, as an example, an SAR ADC based dot-product computation engine for AI inference tasks, where pre-computing the upper bounds for the results may be done based on knowledge of weights (e.g., which are available offline) and maximum values of activations. In the case of 1-bit weights and activations, this corresponds to counting non-zero weight values. Such approaches are also applicable to zero-padding scenarios as described elsewhere herein.

Figure 7:
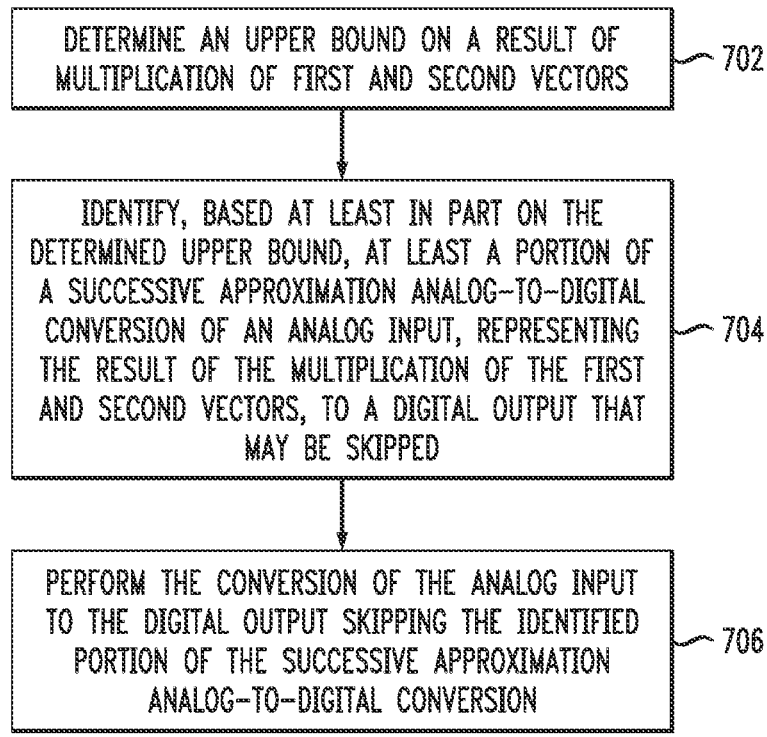
FIG. 7 depicts a methodology for energy-efficient successive approximation analog-to-digital conversion according to an illustrative embodiment.

FIG. 7 depicts a methodology 700 for energy-efficient successive approximation analog-to-digital conversion. The methodology 700 begins with step 702, determining an upper bound on a result of multiplication of first and second vectors. In step 704, a portion of a successive approximation analog-to-digital conversion of an analog input (representing the result of the multiplication of the first and second vectors) to a digital output that may be skipped is identified based at least in part on the determined upper bound. In step 706, the conversion of the analog input to the digital output is performed skipping the identified portion of the successive approximation analog-to-digital conversion.

The multiplication of the first and second vectors may comprise bitwise multiplication. The successive approximation analog-to-digital conversion may comprise a sequence of successive approximation analog-to-digital conversion steps starting from an MSB of the digital output and proceeding through to an LSB of the digital output, and step 704 may comprise identifying a first k number of successive approximation analog-to-digital conversion steps, corresponding to the k MSBs of the digital output, in the sequence of successive approximation analog-to-digital conversion steps to be skipped.

The multiplication of the first and second vectors may be part of an AI workload, the first vector may comprise a set of inputs, and the second vector may comprise a set of weights. Determining the upper bound on the result of multiplication of the first and second vectors may be based at least in part on one or more of: knowledge of values of the set of weights; knowledge of maximum values of the set of inputs; and an amount of zero-padding in the AI workload.

Figure 8:
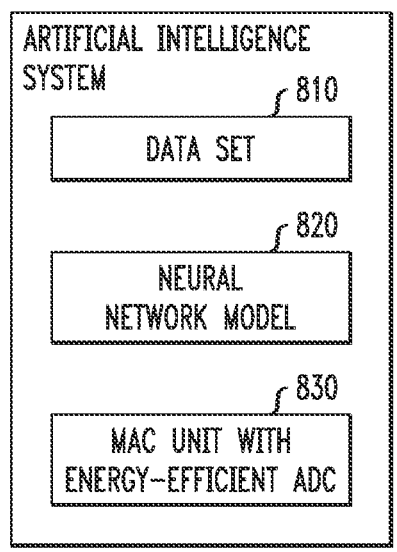
FIG. 8 depicts an exemplary implementation of an artificial intelligence system according to an illustrative embodiment.

FIG. 8 depicts an exemplary implementation of an artificial intelligence system 800 according to an illustrative embodiment. As shown, system 800 comprises a data set 810, a neural network model 820, and a MAC unit with an energy-efficient ADC 830. The MAC unit with the energy-efficient ADC 830 implements the use of bit skipping for certain SAR ADC conversion steps as described elsewhere herein, to perform computations for the neural network model 820 utilizing the data set 810, which may comprise training data in a training mode or inference data set in an inference mode.

In one exemplary embodiment, the artificial intelligence system 800 is implemented by one or more application-specific integrated circuits (ASICs). ASICs are integrated circuit (IC) chips or devices customized for a particular purpose that comprise logic (e.g., circuitry, processors, memory, etc.) that are programmed with executable program code (e.g., instruction code, computer program code, etc.) or otherwise configured for the particular purpose. In this exemplary case, the particular purpose is the implementation and execution of an artificial intelligence system (e.g., machine learning algorithm). An ASIC is also considered a system-on-chip (SoC). Some ASIC implementations that can be used with one or more illustrative embodiments employ cell libraries of user selectable basic logic functions (e.g., a multiplexer, a comparator, etc. that are comprised of multiple VLSI transistor devices to provide various functions such as switching, comparing, etc.) to enable configuration (and reconfiguration) of the system.

It is to be further appreciated that artificial intelligence system 800 and the parts thereof can be realized in alternative circuitry/processor-based technology such as technology including one or more multi-core central processing units (CPUs), one or more graphics processing units (GPUs), and one or more field programmable gate arrays (FPGAs). In some embodiments, artificial intelligence system 800 can be implemented as a combination of two or more circuitry/processor-based technologies (e.g., ASIC, CPU, GPU, FPGA, etc.).

The techniques depicted in FIGS. 1-8 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIGS. 1-8 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

In some embodiments, an apparatus comprises at least one processor and at least one memory including instruction code. The at least one memory and the instruction code are configured to, with the at least one processor, cause the apparatus at least to perform a successive approximation analog-to-digital conversion of an analog input, representing a result of multiplication of first and second vectors, to a digital output by determining an upper bound on the result of multiplication of the first and second vectors, identifying, based at least in part on the determined upper bound, at least a portion of the successive approximation analog-to-digital conversion to be skipped, and skipping the identified portion of the successive approximation analog-to-digital conversion.

The multiplication of the first and second vectors may comprise bitwise multiplication. The successive approximation analog-to-digital conversion may comprise a sequence of successive approximation analog-to-digital conversion steps starting from an MSB of the digital output and proceeding through to an LSB of the digital output. Identifying the portion of the successive approximation analog-to-digital conversion to be skipped may comprise identifying a first k number of successive approximation analog-to-digital conversion steps, corresponding to the k MSBs of the digital output, in the sequence of successive approximation analog-to-digital conversion steps to be skipped.

The multiplication of the first and second vectors may be part of an AI workload, the first vector may comprise a set of inputs, and the second vector may comprise a set of weights. Determining the upper bound on the result of multiplication of the first and second vectors may be based at least in part on knowledge of values of the set of weights. The set of weights may comprise one-bit weights, and determining the upper bound on the result of the multiplication of the first and second vectors may be based at least in part on a count of non-zero weight values in the set of weights. Determining the upper bound on the result of the multiplication of the first and second vectors may be further or alternatively based at least in part on knowledge of maximum values of the set of inputs. Determining the upper bound on the result of the multiplication of the first and second vectors may be further or alternatively based at least in part on an amount of zero-padding in the artificial intelligence workload.

The multiplication of the first and second vectors may comprise binary multiplication of the first and second vectors performed utilizing multiply-accumulate circuitry comprising a set of one or more instances of bitwise dot-product summation circuitry each comprising an instance of bitwise dot-product computation circuitry coupled to an instance of SAR ADC circuitry.

In some embodiments, a method of performing a successive approximation analog-to-digital conversion of an analog input representing a result of multiplication of first and second vectors to a digital output comprises the steps of determining an upper bound on the result of multiplication of the first and second vectors, identifying, based at least in part on the determined upper bound on the result of multiplication of the first and second vectors, at least a portion of the successive approximation analog-to-digital conversion to be skipped, and skipping the identified portion of the successive approximation analog-to-digital conversion. The method is executed by processing circuitry configured to execute instruction code.

The multiplication of the first and second vectors may comprise bitwise multiplication, the successive approximation analog-to-digital conversion may comprise a sequence of successive approximation analog-to-digital conversion steps starting from an MSB of the digital output and proceeding through to an LSB of the digital output, and wherein identifying the portion of the successive approximation analog-to-digital conversion to be skipped comprises identifying a first k number of successive approximation analog-to-digital conversion steps, corresponding to the k MSBs of the digital output, in the sequence of successive approximation analog-to-digital conversion steps to be skipped.

The multiplication of the first and second vectors may be part of an AI workload, the first vector may comprise a set of inputs, and the second vector may comprise a set of weights. Determining the upper bound on the result of multiplication of the first and second vectors may be based at least in part on at least one of: knowledge of values of the set of weights; and knowledge of maximum values of the set of inputs. Determining the upper bound on the result of the multiplication of the first and second vectors may be further or alternatively based at least in part on an amount of zero-padding in the AI workload.

In some embodiments, an article of manufacture comprises a non-transitory computer-readable storage medium having embodied therein executable instruction code that when executed by a processor causes the processor to perform the steps of the above method.

In some embodiments, a system comprises a multiply-accumulate unit configured to perform binary multiplication of first and second vectors. The multiply-accumulate unit comprises a set of one or more bitwise dot-product summation units each configured to perform bitwise multiplication of at least a portion of the first and second vectors to produce a digital output. Each bitwise dot-product summation unit of the set of one or more bitwise dot-product summation units comprises an instance of a bitwise dot-product computation unit coupled to an instance of a successive approximation register analog-to-digital converter unit, each instance of the successive approximation register analog-to-digital converter unit being configured to convert an analog output of the instance of the dot-product computation unit coupled thereto to at least a portion of the digital output. The successive approximation register analog-to-digital converter unit of at least a given bitwise dot-product summation unit of the set of one or more bitwise dot-product summation units is configured to skip at least a portion of a successive approximation analog-to-digital conversion of the analog output of the dot-product computation unit coupled thereto, the portion of the successive approximation analog-to-digital conversion is identified based at least in part on determining an upper bound on a result of the binary multiplication of the first and second vectors.

The binary multiplication of the first and second vectors may comprise bitwise multiplication, the successive approximation analog-to-digital conversion may comprise a sequence of successive approximation analog-to-digital conversion steps starting from an MSB of the digital output and proceeding through to an LSB of the digital output, and the portion of the successive approximation analog-to-digital conversion to be skipped may comprise a first k number of successive approximation analog-to-digital conversion steps, corresponding to the k MSBs of the digital output, in the sequence of successive approximation analog-to-digital conversion steps to be skipped.

The system may be implemented as part of an artificial intelligence system, as part of one or more integrated circuits, combinations thereof, etc.

Figure 9:
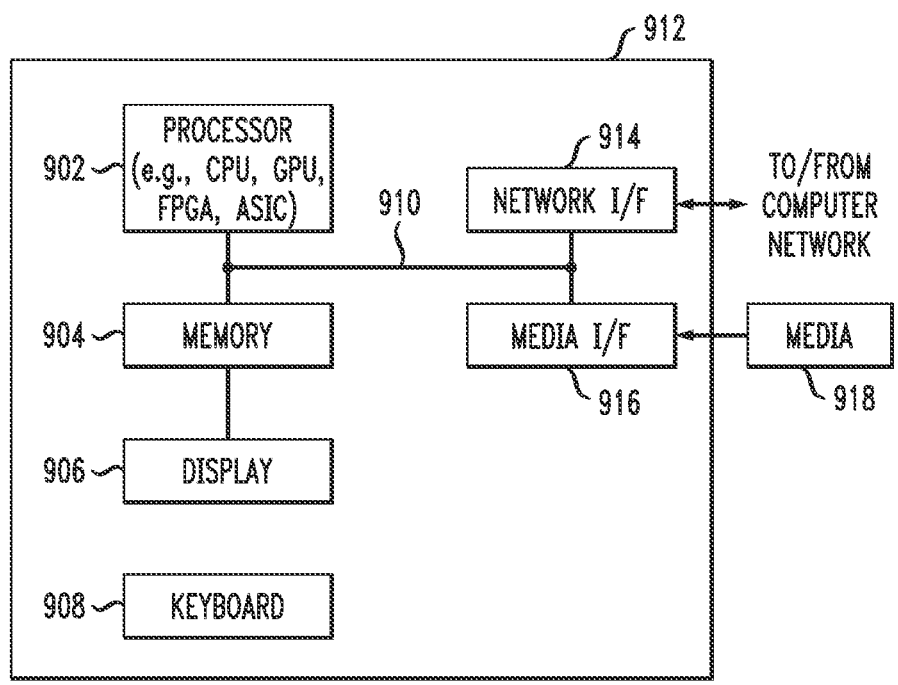
FIG. 9 depicts an exemplary processor system according to an illustrative embodiment.

Additionally, an embodiment of the present invention can make use of software running on a computer or workstation. With reference to FIG. 9, such an implementation might employ, for example, a processor 902, a memory 904, and an input/output interface formed, for example, by a display 906 and a keyboard 908. The term "processor" as used herein is intended to include any processing device, such as, for example, one that includes a multi-core CPU, GPU, FPGA and/or other forms of processing circuitry such as one or more ASICs. Further, the term "processor" may refer to more than one individual processor. The term "memory" is intended to include memory associated with a processor (e.g., CPU, GPU, FPGA, ASIC, etc.) such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 902, memory 904, and input/output interface such as display 906 and keyboard 908 can be interconnected, for example, via bus 910 as part of a data processing unit 912. Suitable interconnections, for example via bus 910, can also be provided to a network interface 914, such as a network card, which can be provided to interface with a computer network, and to a media interface 916, such as a diskette or CD-ROM drive, which can be provided to interface with media 918.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 902 coupled directly or indirectly to memory elements 904 through a system bus 910. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 908, displays 906, pointing devices, and the like) can be coupled to the system either directly (such as via bus 910) or through intervening I/O controllers (omitted for clarity).

Network adapters such as network interface 914 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 912 as shown in FIG. 9) running a server program. It will be understood that such a physical server may or may not include a display and keyboard.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random-access memory (RAM), a read-only memory (ROM), an erasable programmable read-only memory (EPROM or Flash memory), an SRAM, a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 902. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICs), functional circuitry, an appropriately programmed digital computer with associated memory, and the like. Given the teachings of the invention provided herein, one of ordinary skill in the related art will be able to contemplate other implementations of the components of the invention.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (for example, country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (for example, storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (for example, web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (for example, host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (for example, mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (for example, cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 10:
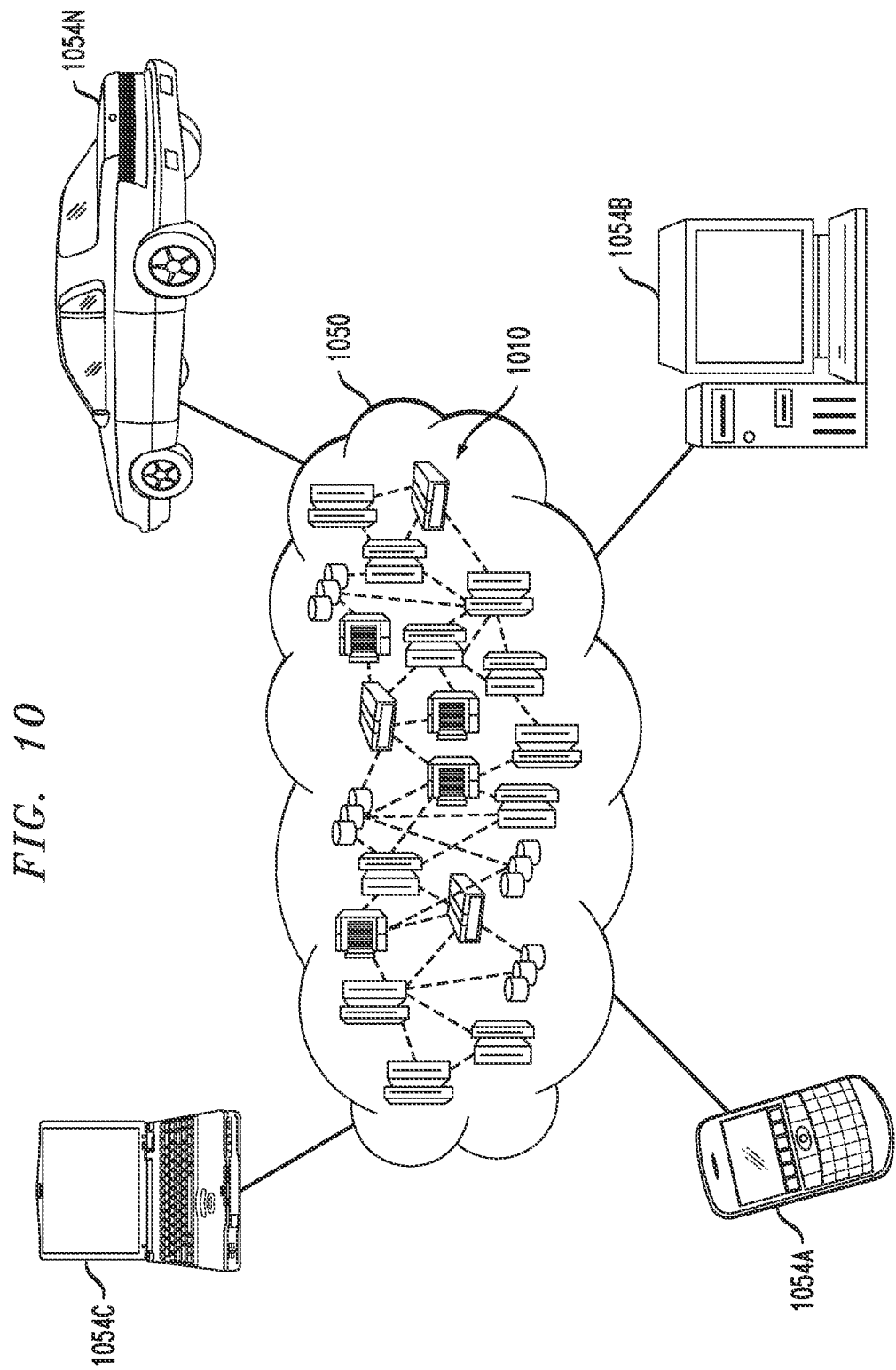
FIG. 10 depicts a cloud computing environment according to an illustrative embodiment.

Referring now to FIG. 10, illustrative cloud computing environment 1050 is depicted. As shown, cloud computing environment 1050 includes one or more cloud computing nodes 1010 with which local computing devices used by cloud consumers, such as, for example, personal digital assistant (PDA) or cellular telephone 1054A, desktop computer 1054B, laptop computer 1054C, and/or automobile computer system 1054N may communicate. Nodes 1010 may communicate with one another. They may be grouped (not shown) physically or virtually, in one or more networks, such as Private, Community, Public, or Hybrid clouds as described hereinabove, or a combination thereof. This allows cloud computing environment 1050 to offer infrastructure, platforms and/or software as services for which a cloud consumer does not need to maintain resources on a local computing device. It is understood that the types of computing devices 1054A-N shown in FIG. 10 are intended to be illustrative only and that computing nodes 1010 and cloud computing environment 1050 can communicate with any type of computerized device over any type of network and/or network addressable connection (e.g., using a web browser).

Figure 11:
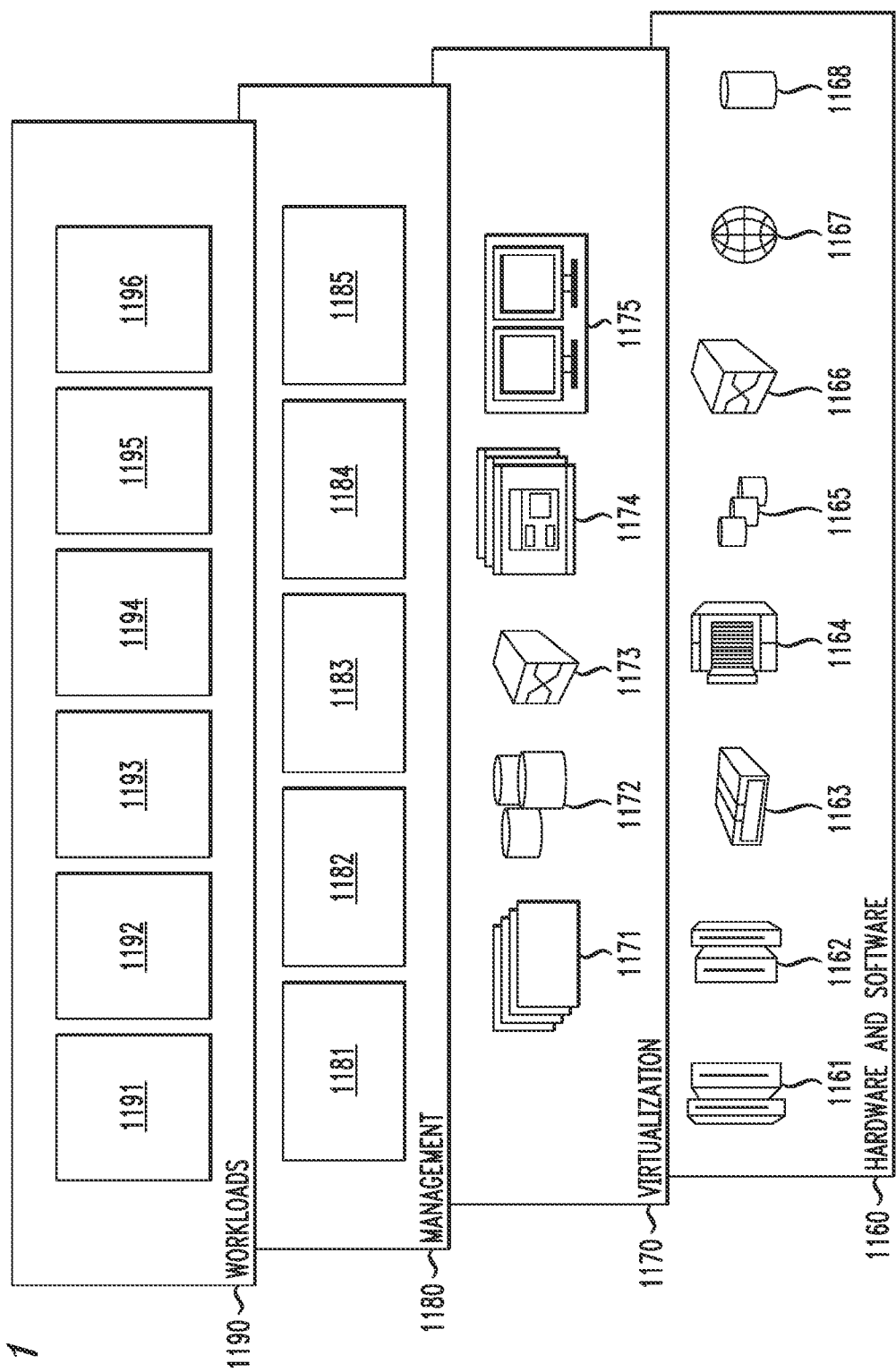
FIG. 11 depicts abstraction model layers according to an illustrative embodiment.

Referring now to FIG. 11, a set of functional abstraction layers provided by cloud computing environment 1050 (FIG. 10) is shown. It should be understood in advance that the components, layers, and functions shown in FIG. 11 are intended to be illustrative only and embodiments of the invention are not limited thereto. As depicted, the following layers and corresponding functions are provided:

Hardware and software layer 1160 includes hardware and software components. Examples of hardware components include: mainframes 1161; RISC (Reduced Instruction Set Computer) architecture-based servers 1162; servers 1163; blade servers 1164; storage devices 1165; and networks and networking components 1166. In some embodiments, software components include network application server software 1167 and database software 1168.

Virtualization layer 1170 provides an abstraction layer from which the following examples of virtual entities may be provided: virtual servers 1171; virtual storage 1172; virtual networks 1173, including virtual private networks; virtual applications and operating systems 1174; and virtual clients 1175.

In one example, management layer 1180 may provide the functions described below. Resource provisioning 1181 provides dynamic procurement of computing resources and other resources that are utilized to perform tasks within the cloud computing environment. Metering and Pricing 1182 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1183 provides access to the cloud computing environment for consumers and system administrators. Service level management 1184 provides cloud computing resource allocation and management such that required service levels are met. Service Level Agreement (SLA) planning and fulfillment 1185 provide pre-arrangement for, and procurement of, cloud computing resources for which a future requirement is anticipated in accordance with an SLA.

Workloads layer 1190 provides examples of functionality for which the cloud computing environment may be utilized. Examples of workloads and functions which may be provided from this layer include: mapping and navigation 1191; software development and lifecycle management 1192; virtual classroom education delivery 1193; data analytics processing 1194; transaction processing 1195; and artificial intelligence algorithm (with energy-efficient MS-DPE/MS-MAC computations) processing 1196, in accordance with the one or more embodiments of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   at least one processor; and
   at least one memory including instruction code;
   the at least one memory and the instruction code being configured to, with the at least one processor, cause the apparatus at least to perform a successive approximation analog-to-digital conversion of an analog input, representing a result of multiplication of first and second vectors, to a digital output by:
      determining an upper bound on the result of multiplication of the first and second vectors;

identifying, based at least in part on the determined upper bound, at least a portion of the successive approximation analog-to-digital conversion to be skipped; and skipping the identified portion of the successive approximation analog-to-digital conversion;

wherein the first vector comprises a set of inputs and the second vector comprises a set of weights; and wherein determining the upper bound on the result of multiplication of the first and second vectors is based at least in part on at least one of: knowledge of values of the set of weights; and knowledge of maximum values of the set of inputs.

2. The apparatus of claim 1, wherein the multiplication of the first and second vectors comprises bitwise multiplication.

3. The apparatus of claim 2, wherein the successive approximation analog-to-digital conversion comprises a sequence of successive approximation analog-to-digital conversion steps starting from a most significant bit of the digital output and proceeding through to a least significant bit of the digital output.

4. The apparatus of claim 3, wherein identifying the portion of the successive approximation analog-to-digital conversion to be skipped comprises identifying a first k number of successive approximation analog-to-digital conversion steps, corresponding to the k most significant bits of the digital output, in the sequence of successive approximation analog-to-digital conversion steps to be skipped.

5. The apparatus of claim 1, wherein the multiplication of the first and second vectors is part of an artificial intelligence workload.

6. The apparatus of claim 5, wherein determining the upper bound on the result of multiplication of the first and second vectors is based at least in part on the knowledge of the values of the set of weights.

7. The apparatus of claim 6, wherein the set of weights comprise one-bit weights, and wherein determining the upper bound on the result of the multiplication of the first and second vectors is based at least in part on a count of non-zero weight values in the set of weights.

8. The apparatus of claim 5, wherein determining the upper bound on the result of the multiplication of the first and second vectors is based at least in part on the knowledge of the maximum values of the set of inputs.

9. The apparatus of claim 5, wherein determining the upper bound on the result of the multiplication of the first and second vectors is based at least in part on an amount of zero-padding in the artificial intelligence workload.

10. The apparatus of claim 1, wherein the multiplication of the first and second vectors comprises binary multiplication of the first and second vectors performed utilizing multiply-accumulate circuitry comprising a set of one or more instances of bitwise dot-product summation circuitry each comprising an instance of bitwise dot-product computation circuitry coupled to an instance of successive approximation register analog-to-digital conversion circuitry.

11. A method of performing a successive approximation analog-to-digital conversion of an analog input representing a result of multiplication of first and second vectors to a digital output, comprising the steps of:

determining an upper bound on the result of multiplication of the first and second vectors;

identifying, based at least in part on the determined upper bound on the result of multiplication of the first and second vectors, at least a portion of the successive approximation analog-to-digital conversion to be skipped; and skipping the identified portion of the successive approximation analog-to-digital conversion;

wherein the first vector comprises a set of inputs and the second vector comprises a set of weights;

wherein determining the upper bound on the result of multiplication of the first and second vectors is based at least in part on at least one of: knowledge of values of the set of weights; and knowledge of maximum values of the set of inputs; and wherein the method is executed by processing circuitry configured to execute instruction code.

12. The method of claim 11, wherein the multiplication of the first and second vectors comprises bitwise multiplication, wherein the successive approximation analog-to-digital conversion comprises a sequence of successive approximation analog-to-digital conversion steps starting from a most significant bit of the digital output and proceeding through to a least significant bit of the digital output, and wherein identifying the portion of the successive approximation analog-to-digital conversion to be skipped comprises identifying a first k number of successive approximation analog-to-digital conversion steps, corresponding to the k most significant bits of the digital output, in the sequence of successive approximation analog-to-digital conversion steps to be skipped.

13. The method of claim 11, wherein the multiplication of the first and second vectors is part of an artificial intelligence workload.

14. The method of claim 13, wherein determining the upper bound on the result of multiplication of the first and second vectors is based at least in part on the knowledge of the values of the set of weights and the knowledge of the maximum values of the set of inputs.

15. The method of claim 13, wherein determining the upper bound on the result of the multiplication of the first and second vectors is based at least in part on an amount of zero-padding in the artificial intelligence workload.

16. An article of manufacture comprising a non-transitory computer-readable storage medium having embodied therein executable instruction code that when executed by a processor causes the processor to perform the steps of the method of claim 11.

17. A system comprising:

a multiply-accumulate unit configured to perform binary multiplication of first and second vectors;

wherein the multiply-accumulate unit comprises a set of one or more bitwise dot-product summation units each configured to perform bitwise multiplication of at least a portion of the first and second vectors to produce a digital output;

wherein each bitwise dot-product summation unit of the set of one or more bitwise dot-product summation units comprises an instance of a bitwise dot-product computation unit coupled to an instance of a successive approximation register analog-to-digital converter unit, each instance of the successive approximation register analog-to-digital converter unit being configured to convert an analog output of the instance of the dot-product computation unit coupled thereto to at least a portion of the digital output;

wherein the successive approximation register analog-to-digital converter unit of at least a given bitwise dot-product summation unit of the set of one or more bitwise dot-product summation units is configured to skip at least a portion of a successive approximation analog-to-digital conversion of the analog output of the dot-product computation unit coupled thereto, the portion of the successive approximation analog-to-digital conversion is identified based at least in part on determining an upper bound on a result of the binary multiplication of the first and second vectors;

wherein the first vector comprises a set of inputs and the second vector comprises a set of weights; and wherein determining the upper bound on the result of multiplication of the first and second vectors is based at least in part on at least one of: knowledge of values of the set of weights; and knowledge of maximum values of the set of inputs.

18. The system of claim 17, wherein the binary multiplication of the first and second vectors comprises bitwise multiplication, wherein the successive approximation analog-to-digital conversion comprises a sequence of successive approximation analog-to-digital conversion steps starting from a most significant bit of the digital output and proceeding through to a least significant bit of the digital output, and wherein the portion of the successive approximation analog-to-digital conversion to be skipped comprises a first k number of successive approximation analog-to-digital conversion steps, corresponding to the k most significant bits of the digital output, in the sequence of successive approximation analog-to-digital conversion steps to be skipped.

19. The system of claim 17, wherein the system is implemented as part of an artificial intelligence system.

20. The system of claim 17, wherein the system is implemented as part of one or more integrated circuits.

* * * * *